(12) United States Patent
Kim

(10) Patent No.: US 10,957,542 B2
(45) Date of Patent: *Mar. 23, 2021

(54) METHOD OF PROCESSING WAFER

(71) Applicant: DISCO CORPORATION, Tokyo (JP)

(72) Inventor: Youngsuk Kim, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/700,534

(22) Filed: Dec. 2, 2019

(65) Prior Publication Data

US 2020/0176257 A1 Jun. 4, 2020

(30) Foreign Application Priority Data

Dec. 3, 2018 (JP) .............................. JP2018-226357

(51) Int. Cl.
*H01L 21/28* (2006.01)
*H01L 21/02* (2006.01)
*H01L 21/304* (2006.01)

(52) U.S. Cl.
CPC .. *H01L 21/28008* (2013.01); *H01L 21/02013* (2013.01); *H01L 21/02016* (2013.01); *H01L 21/304* (2013.01)

(58) Field of Classification Search
None
See application file for complete search history.

(56) References Cited

U.S. PATENT DOCUMENTS

| 2012/0252212 A1* | 10/2012 | Nishida | H01L 21/30608 |
| | | | 438/691 |
| 2013/0133938 A1* | 5/2013 | Sato | H05K 1/115 |
| | | | 174/261 |
| 2016/0042996 A1* | 2/2016 | Yakoo | H01L 21/6708 |
| | | | 438/462 |
| 2016/0104626 A1* | 4/2016 | Nelson | H01L 23/3114 |
| | | | 438/114 |

FOREIGN PATENT DOCUMENTS

JP 2014033160 A 2/2014

* cited by examiner

*Primary Examiner* — Shamim Ahmed
(74) *Attorney, Agent, or Firm* — Greer Burns & Crain Ltd.

(57) ABSTRACT

A method of processing a wafer includes a grinding step of grinding a reverse side of a wafer that has first insulating films covering via electrodes, an electrode protruding step of protruding the via electrodes covered with the first insulating films from the reverse side by supplying a first etching gas turned to a plasma, an insulating film forming step of covering the reverse side with a second insulating film, a via electrode exposing step of supplying a second etching gas turned to a plasma to expose the via electrodes after having formed a resist film having openings overlapping the via electrodes, and an electrode forming step of forming electrodes connected to the via electrodes.

6 Claims, 11 Drawing Sheets

METHOD OF PROCESSING WAFER

BACKGROUND OF THE INVENTION

Field of the Invention

The present invention relates to a method of processing a wafer with via electrodes embedded therein.

Description of the Related Art

Device chips incorporated in electronic equipment are fabricated by establishing a plurality of intersecting projected dicing lines on the face side of a wafer made of a semiconductor material or the like, forming devices in respective areas demarcated by the projected dicing lines, and dividing the wafer along the projected dicing lines. In recent years, there have been demands for low-profile device chips to make themselves into a space saver. To meet such demands, before a wafer with devices formed in respective demarcated areas thereof is divided, the wafer is ground on its reverse side to thin itself to a predetermined finished thickness. In addition, it has been desired to reduce the size of areas where device chips are to be installed on given objects and also to attain higher performance in device chips. One solution is to produce a package chip by layering a plurality of device chips and housing the stack in one package.

Heretofore, the plurality of device chips included in the package chip are connected together by wire bonding or the like. The package has been relatively large as it requires an additional space for accommodating bonding wires that interconnect the device chips. As a result, efforts to produce multi-layer assemblies of device chips with bonding wires have had limitations. There has been developed a technology in which via electrodes, i.e., through-electrodes, extending through the device chips in the thicknesswise directions of device chips are formed in the device chips, and the device chips are interconnected by the via electrodes. For example, a technology in which via electrodes formed in device chips divided from a silicon wafer are used to interconnect upper and lower device chips is referred to as through-silicon via (TSV). As the via electrodes can be made shorter than bonding wires, the TSV technology contributes to speeding up of the processing operation of package chips.

Device chips with via electrodes are fabricated according to the following procedure. First, a disk-shaped wafer is prepared. Then, before or after devices are formed on the wafer, via electrodes are embedded into the wafer from its face side to a predetermined depth in excess of the finished thickness of device chips in respective areas demarcated by projected dicing lines. In order to insulate the via electrodes and the wafer from each other and due to circumstances of the process of forming the via electrodes, insulating films such as silicon oxide films or the like are formed on the inner wall surfaces of via holes in which the via electrodes are embedded. Then, the wafer is ground on its reverse side, and thereafter, the via electrodes are exposed on the reverse side of the wafer. Furthermore, electrodes or bumps are formed as terminals on the exposed portions of the via electrodes, after which the wafer is divided along the projected dicing lines (see Japanese Patent Laid-Open No. 2014-33160).

SUMMARY OF THE INVENTION

For exposing the via electrodes embedded in the wafer on the reverse side thereof, an infrared radiation or the like that has a wavelength transmittable through a semiconductor material of the wafer such as silicon is applied to the wafer from its reverse side to detect the distance or depth between the bottoms of the via electrodes and the reverse side of the wafer. Then, the wafer is ground on the reverse side to the extent that the insulating films covering the via electrodes will not be exposed. Moreover, the reverse side of the wafer is etched to thin the wafer to the finished thickness of the device chips, so that the via electrodes protrude from the reverse side of the wafer. Thereafter, a silicon nitride film is formed on the reverse side of the wafer as a gettering layer for preventing metal elements, etc. from being diffused into the wafer, i.e., the device chips, from outside, and then a silicon oxide film is formed on the reverse side of the wafer as a passivation film. Subsequently, the gettering layer overlapping the via electrodes, the passivation film, and the insulating films covering the via electrodes are removed by chemical mechanical polishing (CMP), thereby exposing the via electrodes on the reverse side of the wafer. Then, electrodes or bumps are formed as terminals on the exposed via electrodes.

Since the device chips with the via electrodes are produced through a number of steps, as described above, the manufacturing cost of the device chips tends to be high. Accordingly, there are demands for simplifying the steps. For example, as the step of removing respective insulating films by CMP is highly costly, it is desirable to dispense with the CMP step in order to reduce the manufacturing cost of the device chips.

It is therefore an object of the present invention to provide a method of processing a wafer at a lower cost by simplifying steps of processing the wafer with via electrodes embedded therein to produce device chips with the via electrodes.

In accordance with an aspect of the present invention, there is provided a method of processing a wafer, including the steps of: placing a protective member on a face side of a wafer having a plurality of intersecting projected dicing lines thereon that demarcate the face side into areas with devices formed therein, the areas having via electrodes embedded in the wafer and extending in thicknesswise directions, and first insulating films covering the via electrodes; holding a protective member side of the wafer on a chuck table and grinding the wafer on a reverse side thereof to an extent that the first insulating films covering the via electrodes are not be exposed; after the step of grinding the wafer, housing the wafer in a vacuum chamber, supplying a first etching gas turned to a plasma to the reverse side of the wafer, thereby protruding the via electrodes covered with the first insulating films from the reverse side of the wafer; after the step of protruding the via electrodes, covering the reverse side of the wafer with a second insulating film; after the step of covering the reverse side of the wafer with the second insulating film, forming a resist film having openings overlapping the via electrodes on the reverse side of the wafer, thereafter supplying a second etching gas turned to a plasma to the reverse side of the wafer to remove regions of the first insulating films and the second insulating films underlying the openings, thereby exposing the via electrodes; after the step of exposing the via electrodes, forming electrodes connected to the exposed via electrodes; and removing the resist film.

Preferably, the step of forming the electrodes includes the step of forming the electrodes connected to the via electrodes by way of plating, using the resist film formed in the step of exposing the via electrodes.

Alternatively, preferably, the method of processing a wafer further includes the steps of, after the step of protruding the via electrodes and before the step of covering the reverse side of the wafer with the second insulating film, forming a distorted layer on the reverse side of the wafer by supplying an inactive gas turned to a plasma to the reverse side of the wafer.

Alternatively, preferably, the step of forming the distorted layer includes the steps of keeping the wafer housed in the vacuum chamber used in the step of protruding the via electrodes, discharging the first etching gas from the vacuum chamber, and then supplying the inactive gas turned to a plasma to the reverse side of the wafer thereby forming the distorted layer.

In the method of processing a wafer according to the aspect of the present invention, the step of grinding the reverse side of the wafer and the step of protruding the via electrodes are carried out to protrude the via electrodes covered with the first insulating films from the reverse side of the wafer, after which the step of exposing the via electrodes is carried out to expose the via electrodes. In the step of exposing the via electrodes, the resist film having the openings overlapping the via electrodes is formed on the reverse side of the wafer, and the first insulating films are removed in the regions overlapping the openings, thereby exposing the via electrodes. Thereafter, the wafer is divided along the projected dicing lines into individual device chips that have the via electrodes. In the method of processing a wafer according to the aspect of the present invention, since the via electrodes can be exposed on the reverse side of the wafer without CMP, the steps of manufacturing the device chips that have the via electrodes are simplified, so that the device chips can be manufactured less costly.

According to the aspect of the present invention, the method of processing a wafer is made less costly by simplifying the steps of processing the wafer with the via electrodes embedded therein to manufacture device chips that have the via electrodes.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Figure 1A:
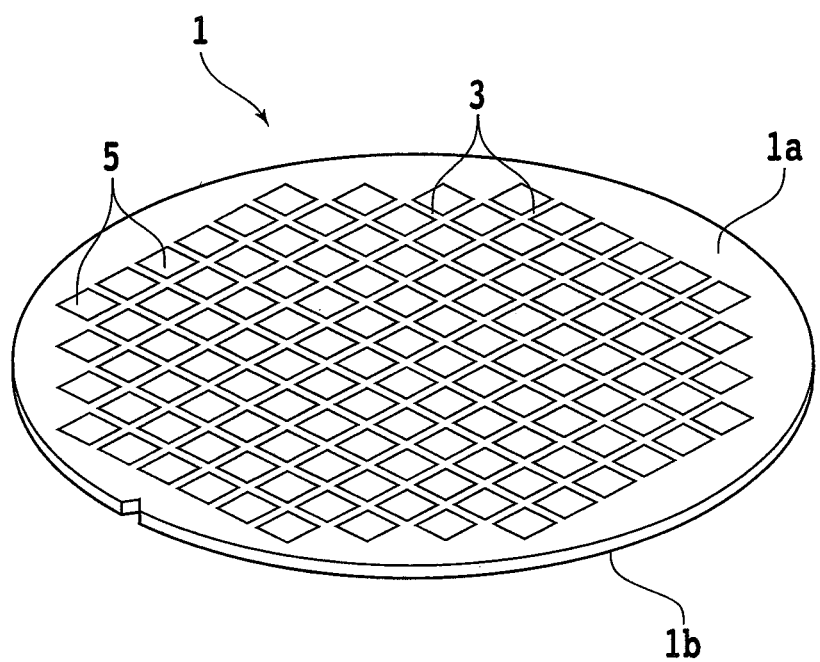
FIG. 1A is a perspective view schematically illustrating a wafer.
Figure 1B:
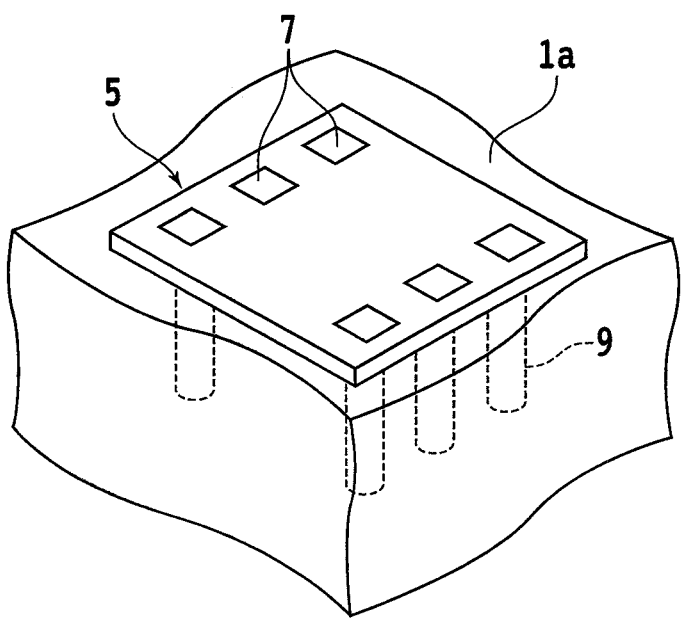
FIG. 1B is a fragmentary perspective view schematically illustrating the wafer at an enlarged scale.

A method of processing a wafer according to a preferred embodiment of the present invention will be described below with reference to the accompanying drawings. First, a wafer as a workpiece to be processed by the method of processing a wafer according to the present embodiment will be described below with reference to FIGS. 1A and 1B. FIG. 1A schematically illustrates in perspective the wafer, denoted by 1, and FIG. 1B schematically illustrates in fragmentary perspective the wafer 1 at an enlarged scale. The wafer 1 is a substantially disk-shaped substrate or the like made of a semiconductor material such as silicon (Si), silicon carbide (SiC), gallium nitride (GaN), gallium arsenide (GaAs), or the like, or a material such as sapphire, glass, quartz, or the like.

A plurality of intersecting projected dicing lines 3 are established in a face side 1a of the wafer 1, demarcating the face side 1a into areas where devices 5 such as integrated circuits (ICs), large scale integrated (LSI) circuits, or the like are formed. The wafer 1 will subsequently be divided along the projected dicing lines 3 into device chips that include the devices 5. In recent years, for making the device chips thin, it is customary to process the wafer 1 on a reverse side 1b thereof to thin the wafer 1 to a predetermined finished thickness before the wafer 1 is divided into the device chips. Furthermore, in order to attain higher performance in the device chips and also to reduce the size of areas where the device chips are to be installed on given objects, a package chip is formed by layering a plurality of device chips and housing the stack of device chips in one package. The layered device chips in the package chip are electrically connected to each other by via electrodes or through-electrodes extending through the device chips in the thicknesswise directions thereof, for example.

Each of the areas of the wafer 1 that are demarcated by the projected dicing lines 3, i.e., each of the areas where the device 5 is formed, has via electrodes 9 embedded therein that extend in the thicknesswise directions of the wafer 1 as illustrated in FIG. 1B. The via electrodes 9 are connected to electrodes 7 of the device 5. The via electrodes 9 are embedded to a thickness in excess of the finished thickness of a single device chip. Thereafter, the wafer 1 is thinned to the finished thickness, thereby exposing the via electrodes 9 on the reverse side, and then electrodes or bumps are formed as terminals on the exposed via electrodes 9. Next, the wafer 1 is divided along the projected dicing lines 3 into the device chips that have the devices 5. When a package chip is formed by layering a plurality of device chips, the devices 5 of the device chips are electrically connected to each other by the via electrodes 9 thereof.

The via electrodes 9 are embedded in the wafer 1 before or after the devices 5 are formed. For embedding the via electrodes 9, recesses called via holes for embedding the via electrodes 9 therein are formed in the face side 1a of the wafer 1 at predetermined positions in the areas of the wafer 1 that are demarcated by the projected dicing lines 3. The via holes are formed to a depth in excess of the finished thickness of the device chips. First insulating films 13 (see FIG. 3B, etc.) are deposited on bottom and inner wall surfaces of the via holes. The first insulating films 13 may be silicon oxide films, for example, and formed by chemical vapor deposition (CVD) or the like. Then, copper (Cu), W, Al, polysilicon, or the like is placed in the via holes, thereby forming the via electrodes 9. Thereafter, the reverse side 1b of the wafer 1 is processed to thin the wafer 1 until the via electrodes 9 are exposed on the reverse side 1b.

Figure 4:
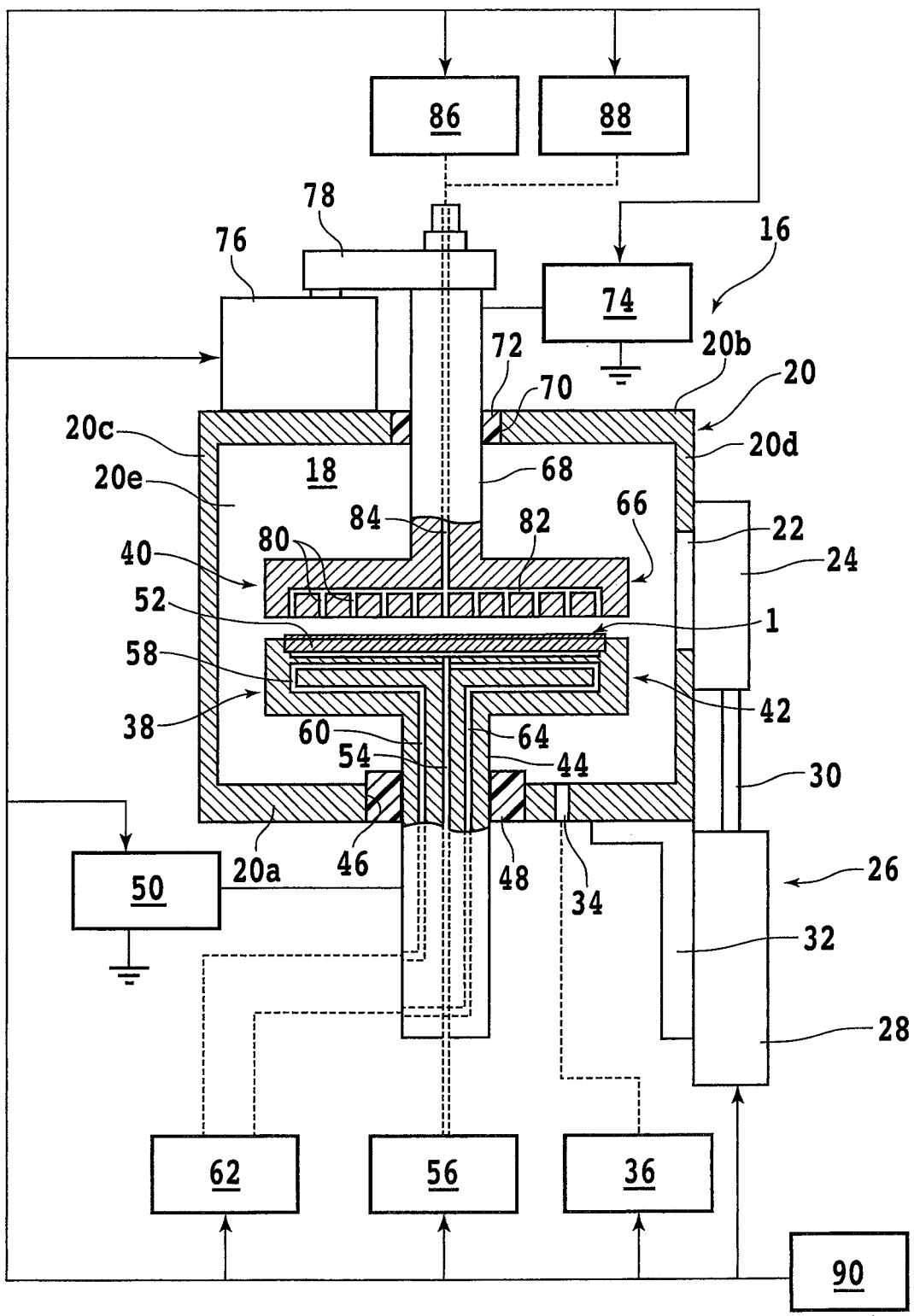
FIG. 4 is a cross-sectional view schematically illustrating a plasma etching apparatus.

Next, an example of a plasma treating apparatus used in the method of processing a wafer according to the present embodiment will be described below. The plasma treating apparatus supplies the reverse side 1b of the wafer 1 with an etching gas turned to a plasma, thereby etching the reverse side 1b of the wafer 1. In addition, an inactive gas turned to a plasma is supplied to the reverse side 1b of the wafer 1, thereby forming a distorted layer on the reverse side 1b of the wafer 1. FIG. 4 is a cross-sectional view schematically illustrating an example of a configuration of the plasma treating apparatus, denoted by 16.

As illustrated in FIG. 4, the plasma treating apparatus 16 includes a vacuum chamber 20 that defines a treatment space 18 therein. The vacuum chamber 20 is in the shape of a rectangular parallelepiped including a bottom wall 20a, an upper wall 20b, a first side wall 20c, a second side wall 20d, a third side wall 20e, and a fourth side wall, not illustrated. The second side wall 20d has an opening 22 defined therein through which the wafer 1 can be loaded into and unloaded out of the treatment space 18. A gate 24 for selectively opening and closing the opening 22 is disposed on an outer side surface of the side wall 20d. The gate 24 is vertically movable by an opening and closing mechanism 26. The opening and closing mechanism 26 includes an air cylinder 28 and a piston rod 30 extending upwardly from the air cylinder 28. The air cylinder 28 is fixed to the bottom wall 20a of the vacuum chamber 20 by a bracket 32. The piston rod 30 has an upper distal end coupled to a lower portion of the gate 24.

When the opening and closing mechanism 26 opens the gate 24, the wafer 1 can be loaded through the opening 22 into the treatment space 18 in the vacuum chamber 20 or can be unloaded through the opening 22 out of the treatment space 18 in the vacuum chamber 20. The bottom wall 20a of the vacuum chamber 20 has a discharging port 34 defined therein that is connected to a discharging mechanism 36 such as a vacuum pump or the like. The treatment space 18 in the vacuum chamber 20 houses therein a lower electrode 38 and an upper electrode 40 that are disposed in vertically facing relation to each other. The lower electrode 38 is made of an electrically conductive material, and includes a disk-shaped holder 42 and a cylindrical support 44 projecting downwardly from a central region of the lower surface of the holder 42. The support 44 is inserted through an opening 46 defined in the bottom wall 20a of the vacuum chamber 20. An annular insulator 48 is disposed in the opening 46 between the bottom wall 20a and the support 44, insulating the vacuum chamber 20 and the lower electrode 38 from each other. The lower electrode 38 is electrically connected to a high-frequency power supply 50 disposed outside of the vacuum chamber 20.

The holder 42 has a cavity defined in the upper surface thereof, and a table 52 for placing the wafer 1 thereon is disposed in the cavity. The table 52 has a suction channel, not illustrated, defined therein that is connected to a suction source 56 through a flow channel 54 defined in the lower electrode 38. The holder 42 also has a cooling flow channel 58 defined therein. The cooling flow channel 58 has an end connected to a coolant circulating mechanism 62 through a coolant introducing channel 60 defined in the support 44. The other end of the cooling flow channel 58 is connected to the coolant circulating mechanism 62 through a coolant discharging channel 64 defined in the support 44. When the coolant circulating mechanism 62 is actuated, a coolant flows successively through the coolant introducing channel 60, the cooling flow channel 58, and the coolant discharging channel 64, thereby cooling the lower electrode 38.

The upper electrode 40 is made of an electrically conductive material, and includes a disk-shaped gas ejector 66 and a cylindrical support 68 projecting upwardly from a central region of the upper surface of the gas ejector 66. The support 68 is inserted through an opening 70 defined in the upper wall 20b of the vacuum chamber 20. An annular insulator 72 is disposed in the opening 70 between the upper wall 20b and the support 68, insulating the vacuum chamber 20 and the upper electrode 40 from each other. The upper electrode 40 is electrically connected to a high-frequency power supply 74 disposed outside of the vacuum chamber 20. A support arm 78 is mounted on an upper end portion of the support 68 and coupled to a lifting and lowering mechanism 76. The upper electrode 40 is vertically movable by the lifting and lowering mechanism 76 and the support arm 78.

The gas ejector 66 has a plurality of ejection ports 80 defined in a lower surface thereof. The ejection ports 80 are connected to a first gas supply 86 and a second gas supply 88 through a flow channel 82 defined in the gas ejector 66 and a flow channel 84 defined in the support 68. The first gas supply 86, the second gas supply 88, the flow channels 82 and 84, and the ejection ports 80 jointly make up a gas introducing assembly for introducing a gas into the vacuum chamber 20. The gas supplies of the gas introducing assembly of the plasma treating apparatus 16 are not limited to the two gas supplies 86 and 88.

The opening and closing mechanism 26, the discharging mechanism 36, the high-frequency power supply 50, the suction source 56, the coolant circulating mechanism 62, the high-frequency power supply 74, the lifting and lowering mechanism 76, the first gas supply 86, and the second gas supply 88, etc. are electrically connected to a controller 90. The controller 90 may be in the form of a computer including a processor such as a central processing unit (CPU) and a storage apparatus such as a flash memory, etc. The central processing unit functions as the controller 90 when it executes programs stored in the storage apparatus. The discharging mechanism 36 supplies information associated with the pressure in the treatment space 18 to the controller 90. The coolant circulating mechanism 62 supplies information associated with the temperature of the coolant, i.e., information associated with the temperature of the lower electrode 38, to the controller 90. Furthermore, the first gas supply 86 and the second gas supply 88 supply information associated with the flow rates of gases flowing therefrom to the controller 90. The controller 90 outputs control signals for controlling the various components referred to above on the basis of the supplied information and other information entered by the user of the plasma treating apparatus 16.

Figure 2A:
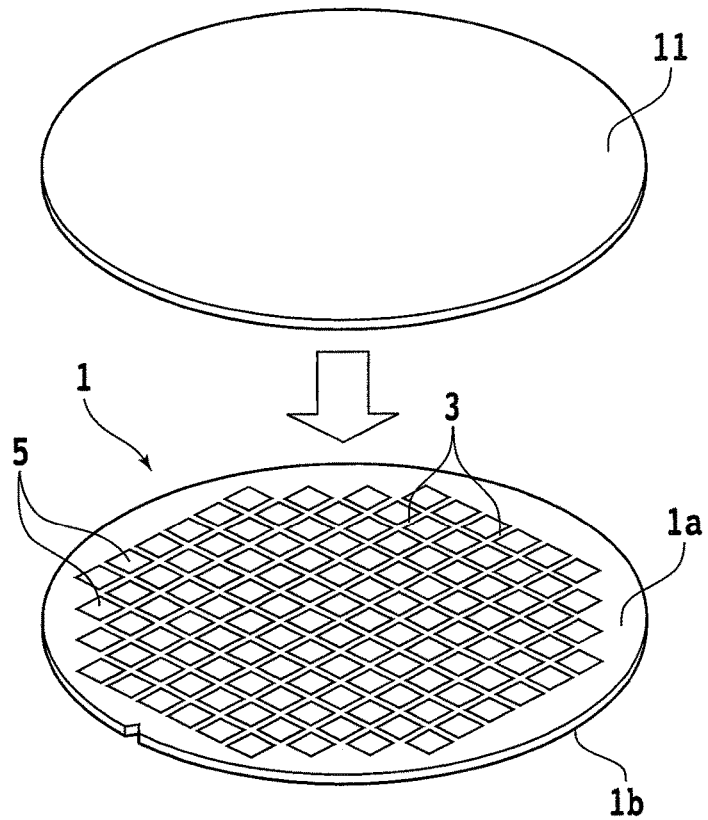
FIG. 2A is a perspective view schematically illustrating a protective member placing step.
Figure 11A:
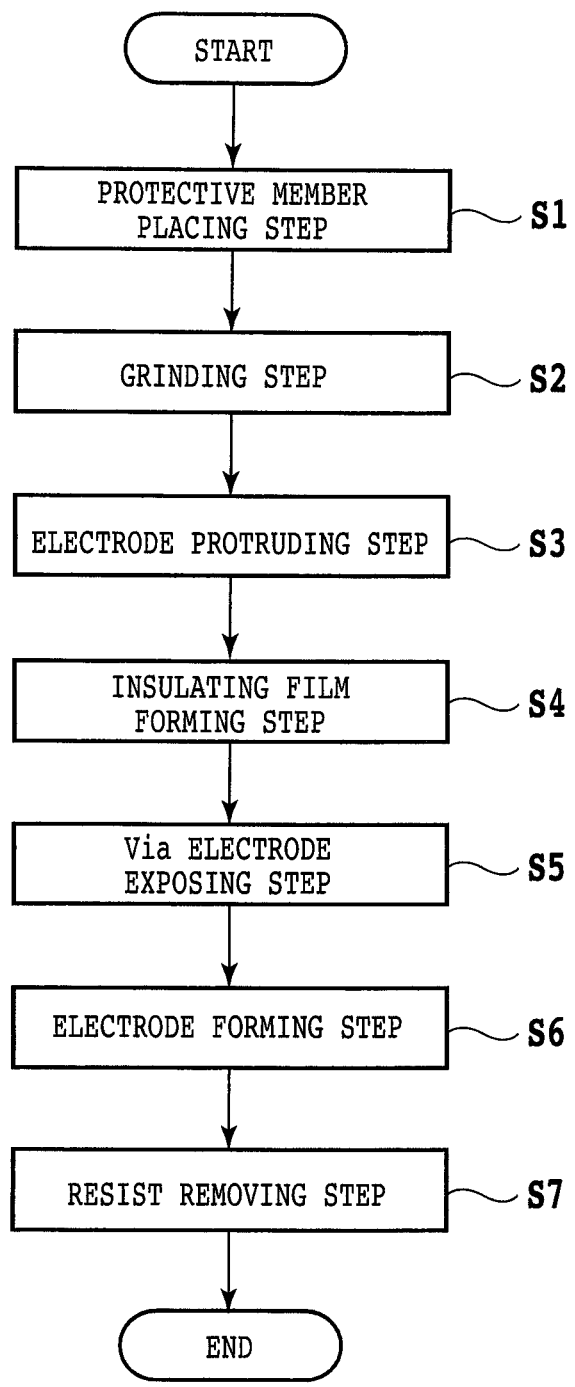
FIG. 11A is a flowchart illustrating an example of a method of processing a wafer.

The method of processing a wafer according to the present embodiment will be described below with reference to FIG. 11A. FIG. 11A is a flowchart illustrating an example of the method of processing a wafer according to the present embodiment. In the method of processing a wafer according to the present embodiment, the protective member placing step S1 is carried out first. FIG. 2A schematically illustrates the protective member placing step S1 in perspective. In the protective member placing step S1, a protective member 11 is placed on the face side 1a of the wafer 1. The protective member 11 functions to protect the devices 5, etc. on the face side 1a of the wafer 1 while the method of processing a wafer according to the present embodiment is being carried out on the wafer 1. The protective member 11 is in the form of a circular adhesive tape having substantially the same diameter as the wafer 1, for example. In the protective member placing step S1, the adhesive tape is stuck to the face side 1a of the wafer 1. The protective member 11 may alternatively be a rigid circular plate made of a material such as glass, resin, ceramics, or the like. In the case where the protective member 11 is a rigid circular plate, it is stuck to the face side 1a of the wafer 1 by an adhesive.

Figure 2B:
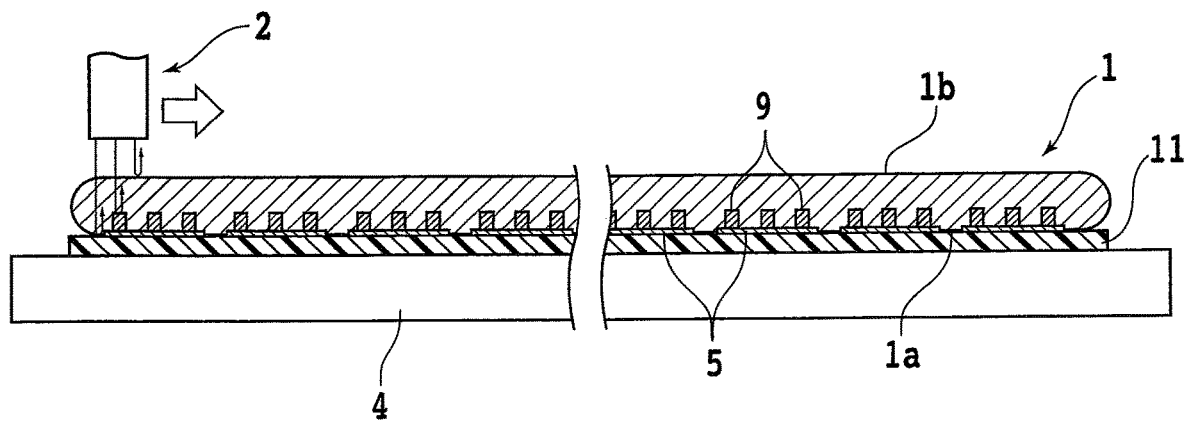
FIG. 2B is a cross-sectional view schematically illustrating the manner in which the depths of via electrodes are measured.

After the protective member placing step S1, the grinding step S2 is performed. In the grinding step S2, the wafer 1 is ground on the reverse side 1b thereof. For performing the grinding step S2, the depths from the reverse side 1b to the distal ends of the via electrodes 9 are measured in advance. Thereafter, the wafer 1 is ground on the reverse side 1b thereof while referring to the measured values of the depths, thereby thinning the wafer 1 to the extent that the via electrodes 9 and the first insulating films 13 (see FIG. 3B, etc.) will not be exposed. FIG. 2B schematically illustrates in cross section the manner in which the depths of the via electrodes 9 are measured. As illustrated in FIG. 2B, the wafer 1 is placed on a chuck table 4 with the face side 1a thereof facing downwardly. Then, a height detecting unit 2 disposed above the chuck table 4 is used to measure the depths of the distal ends of the via electrodes 9. The height detecting unit 2 and the chuck table 4 are included in a grinding apparatus (see FIG. 3A) to be described below, for example. Alternatively, the height detecting unit 2 and the chuck table 4 may be included in an external height measuring apparatus. For example, the height detecting unit 2 is an infrared camera unit that applies an infrared radiation having a wavelength transmittable through the wafer 1 to the reverse side 1b thereof while moving over the wafer 1, and observes a reflected infrared radiation from the wafer 1 to measure the depths of the via electrodes 9 from the reverse side 1b.

Figure 3A:
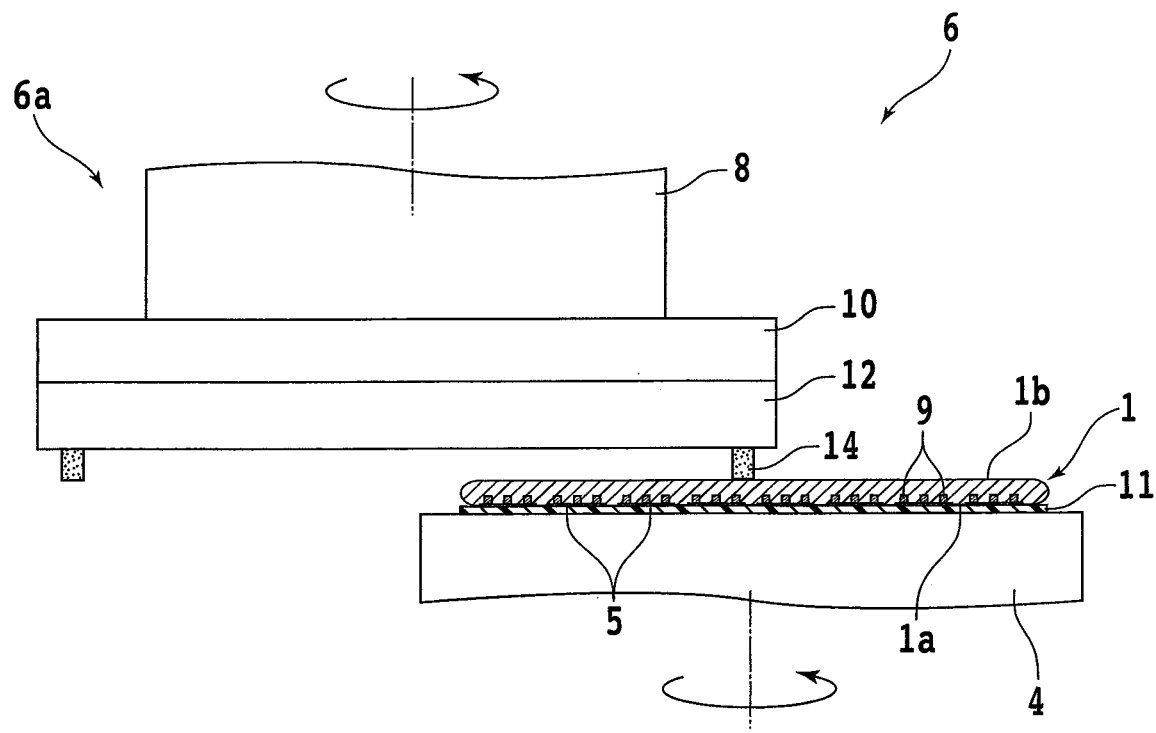
FIG. 3A is a cross-sectional view schematically illustrating a grinding step.

Next, the grinding apparatus for grinding the wafer 1 will be described below with reference to FIG. 3A. FIG. 3A schematically illustrates the grinding step S2 in cross section. The grinding apparatus, denoted by 6, illustrated in FIG. 3A includes the chuck table 4 and a grinding unit 6a disposed above the chuck table 4.

The chuck table 4 has an upper surface as a holding surface where a porous material is exposed. The chuck table 4 has a suction channel, not illustrated, defined therein that has an end connected to the porous material of the holding surface and another end connected to a suction source, not illustrated. The wafer 1 is placed on the holding surface of the chuck table 4 with the face side 1a facing downwardly, and the suction source is actuated to apply a negative pressure to the wafer 1 through the suction channel and the porous material. The wafer 1 is now held under suction on the chuck table 4. The chuck table 4 is rotatable about a central axis perpendicular to the holding surface. The grinding unit 6a disposed above the chuck table 4 includes a spindle 8 whose central axis extends perpendicularly to the holding surface of the chuck table 4, a wheel mount 10 fixed to the lower end of the spindle 8, and a grinding wheel 12 mounted on a lower surface of the wheel mount 10. A grinding stone 14 is mounted on a lower surface of the grinding wheel 12. The upper end of the spindle 8 is connected to a rotary actuator, not illustrated. When the rotary actuator is energized, it rotates the spindle 8 about its central axis, rotating the grinding wheel 12 to cause the grinding stone 14 to move along a circular orbit.

Figure 3B:
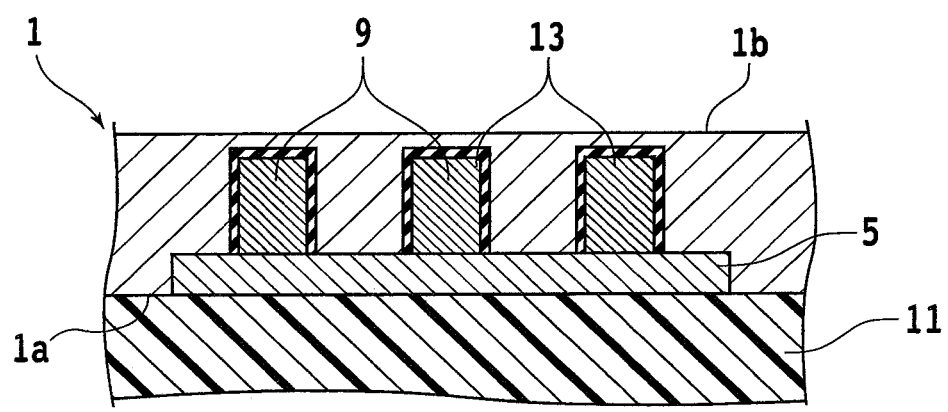
FIG. 3B is a fragmentary cross-sectional view schematically illustrating at an enlarged scale the wafer after the grinding step has been carried out thereon.

In the grinding step S2, the chuck table 4 and the spindle 8 are rotated independently of each other, and the grinding unit 6a is lowered. When the grinding stone 14 that is moving along the circular orbit is lowered into contact with the reverse side 1b of the wafer 1 held on the chuck table 4, the wafer 1 is ground by the grinding stone 14. The grinding unit 6a is lowered to a predetermined vertical position where the via electrodes 9 and the first insulating films 13 (see FIG. 3B, etc.) in the wafer 1 will not be exposed. FIG. 3B schematically illustrates the wafer 1 after the grinding step S2 has been carried out thereon in fragmentary cross section. As illustrated in FIG. 3B, in the grinding step S2, the wafer 1 is ground on the reverse side 1b to the extent that the insulating films 13 covering the via electrodes 9a will not be exposed on the reverse side 1b.

The disk-shaped wafer 1 made of Si or the like has an outer circumferential edge beveled beforehand to prevent itself from being chipped away. Therefore, the face side 1a and reverse side 1b of the wafer 1 are joined to each other by a curved side surface around the outer circumferential edge. When the wafer 1 is ground on the reverse side 1b in the grinding step S2, the outer circumferential edge of the wafer 1 tends to be sharpened into a knife edge, which is likely to cause the wafer 1 to be chipped away. To avoid such a shortcoming, an edge trimming process may be carried out on the wafer 1 to remove the outer circumferential edge of the wafer 1 before the wafer 1 is ground.

In the method of processing a wafer according to the present embodiment, the grinding step S2 is followed by the electrode protruding step S3 for protruding the via electrodes 9 covered with the first insulating films 13 from the reverse side 1b of the wafer 1. The electrode protruding step S3 is carried out by the plasma treating apparatus 16 illustrated in FIG. 4, for example. In the electrode protruding step S3, the opening and closing mechanism 26 lowers the gate 24 of the plasma treating apparatus 16. Then, the wafer 1 is loaded through the opening 22 into the treatment space 18 in the vacuum chamber 20, and placed on the table 52 of the lower electrode 38 with the reverse side 1b exposed upwardly. When the wafer 1 is loaded into the treatment space 18, it is preferable to actuate the lifting and lowering mechanism 76 to lift the upper electrode 40, thereby widening the distance between the lower electrode 38 and the upper electrode 40.

Figure 5A:
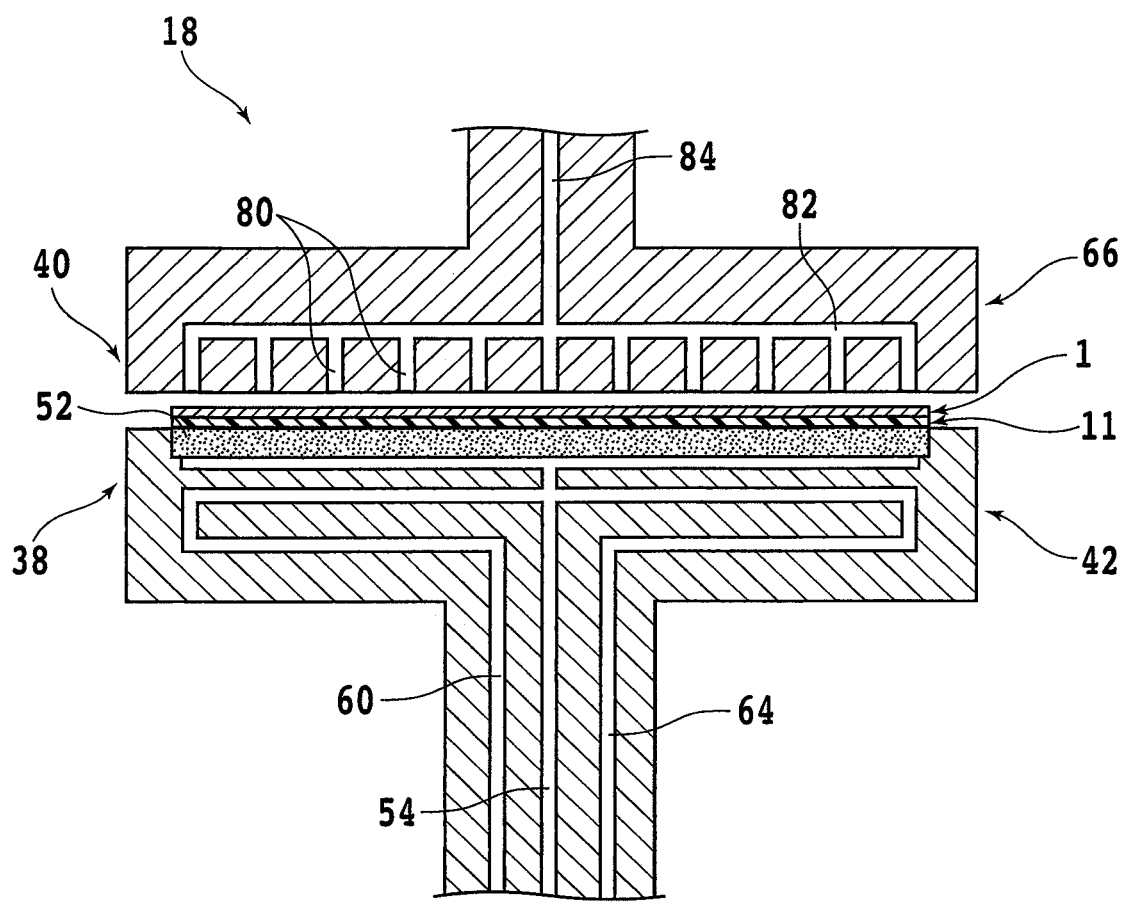
FIG. 5A is a cross-sectional view schematically illustrating the wafer fixed to a table in an electrode protruding step.

Thereafter, the vacuum pressure from the suction source 56 is applied to attract the wafer 1 under suction securely to the table 52. The opening and closing mechanism 26 lifts the gate 24 to seal the treatment space 18. The lifting and lowering mechanism 76 adjusts the vertical position of the upper electrode 40 to bring the upper electrode 40 and the lower electrode 38 into a predetermined positional relationship suitable for plasma processing. The discharging mechanism 36 is actuated to evacuate the treatment space 18 to a lower pressure. FIG. 5A schematically illustrates in cross section the wafer 1 introduced into the plasma treating apparatus 16 in the electrode protruding step S3. After the treatment space 18 has been evacuated, if it is difficult to hold the wafer 1 on the table 52 under the negative pressure from the suction source 56, then the wafer 1 may be held on the table 52 by electric forces, typically electrostatic forces, or the like. For example, an electrode may be embedded in the table 52, and electric power may be supplied to the electrode to apply electric forces between the table 52 and the wafer 1.

Then, while a gas for plasma processing, including a first etching gas, is being introduced from the first gas supply 86 into the treatment space 18 at a predetermined flow rate, predetermined high-frequency electric power is applied between the lower electrode 38 and the upper electrode 40. The first etching gas is $CF_4$ or $SF_6$, for example. The first etching gas is mixed with a hydrogen gas, an oxygen gas, or the like at a predetermined ratio before it is introduced into the treatment space 18. In the electrode protruding step S3, while a predetermined pressure ranging from 5 to 50 Pa, for example, is being maintained in the treatment space 18, the first etching gas is supplied from the first gas supply 86 at the predetermined flow rate to the treatment space 18, and predetermined high-frequency electric power ranging from 1000 to 3000 W, for example, is applied between the lower electrode 38 and the upper electrode 40.

Figure 5B:
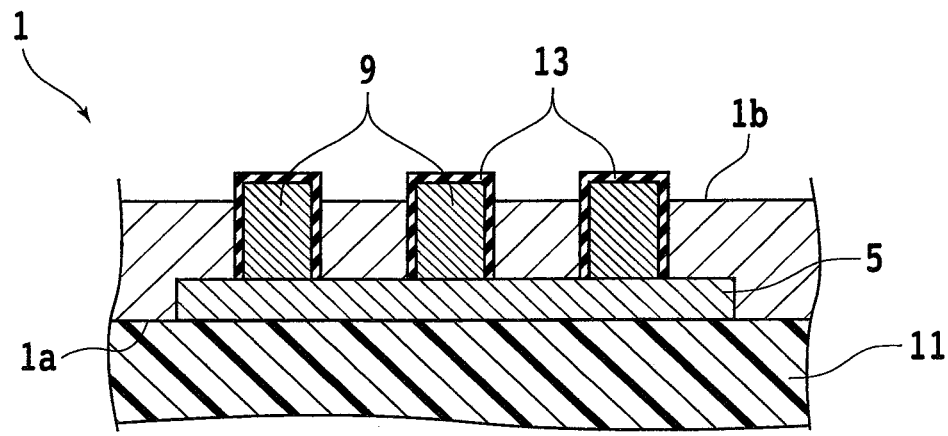
FIG. 5B is a fragmentary cross-sectional view schematically illustrating at an enlarged scale the wafer after the electrode protruding step has been carried out thereon.

Now, a plasma is generated between the lower electrode 38 and the upper electrode 40, and ions produced from the first etching gas turned to the plasma are attracted toward the lower electrode 38 and supplied to the reverse side 1b of the wafer 1. The supplied ions etch the reverse side 1b at a high selection ratio between the wafer 1 and the first insulating films 13. Specifically, when the electrode protruding step S3 is performed, the wafer 1 is gradually etched away, whereas the first insulating films 13 as they are exposed are less likely to be etched away. Therefore, when the electrode protruding step S3 is performed, as illustrated in FIG. 5B, the reverse side 1b of the wafer 1 is etched away or retracted, thereby leaving the via electrodes 9 and the first insulating films 13 protruding from the reverse side 1b of the wafer 1. FIG. 5B schematically illustrates in fragmentary cross section the wafer 1 after the electrode protruding step S3 has been carried out thereon.

Figure 11B:
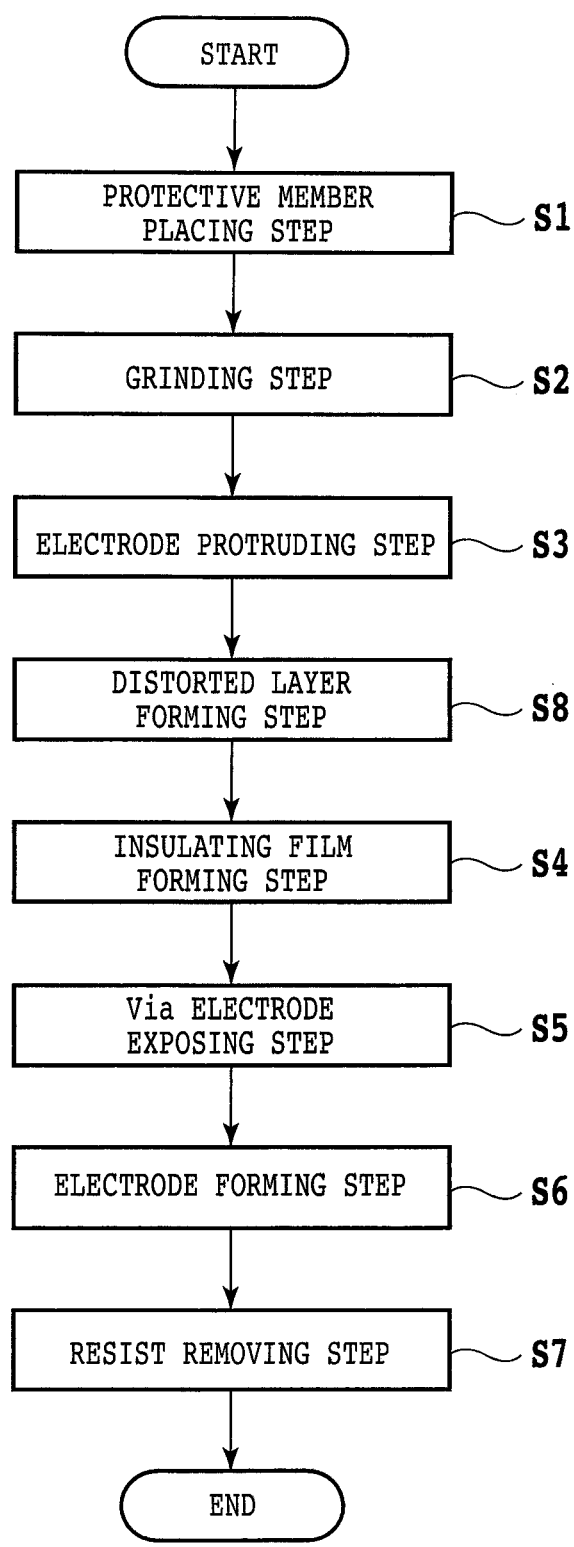
FIG. 11B is a flowchart illustrating another example of a method of processing a wafer.

In the method of processing a wafer according to the present embodiment, after the electrode protruding step S3 has been carried out, the insulating film forming step S4 is carried out to cover the reverse side 1b of the wafer 1 with a second insulating film. However, prior to the insulating film forming step S4, a gettering layer forming step, not illustrated, may be carried out to form a gettering layer. In the gettering layer forming step, a silicon nitride film, for example, is formed as a gettering layer for trapping metal elements that tend to enter the wafer 1 from the reverse side 1b thereof on the reverse side 1b of the wafer 1. The silicon nitride film that functions as the gettering layer is formed by CVD, for example. However, inasmuch as the step of forming a gettering layer by way of CVD or the like needs a film growing apparatus, etc. and is expensive, a distorted layer forming step of forming a distorted layer on the reverse side 1b of the wafer 1 may be carried out instead of the gettering layer forming step. FIG. 11B is a flowchart illustrating a sequence of a method of processing a wafer according to the present embodiment in the case where the distorted layer forming step S8 is carried out. In the distorted layer forming step S8, an inactive gas turned to a plasma is supplied to the reverse side 1b of the wafer 1 to form a distorted layer on the reverse side 1b of the wafer 1.

Figure 6A:
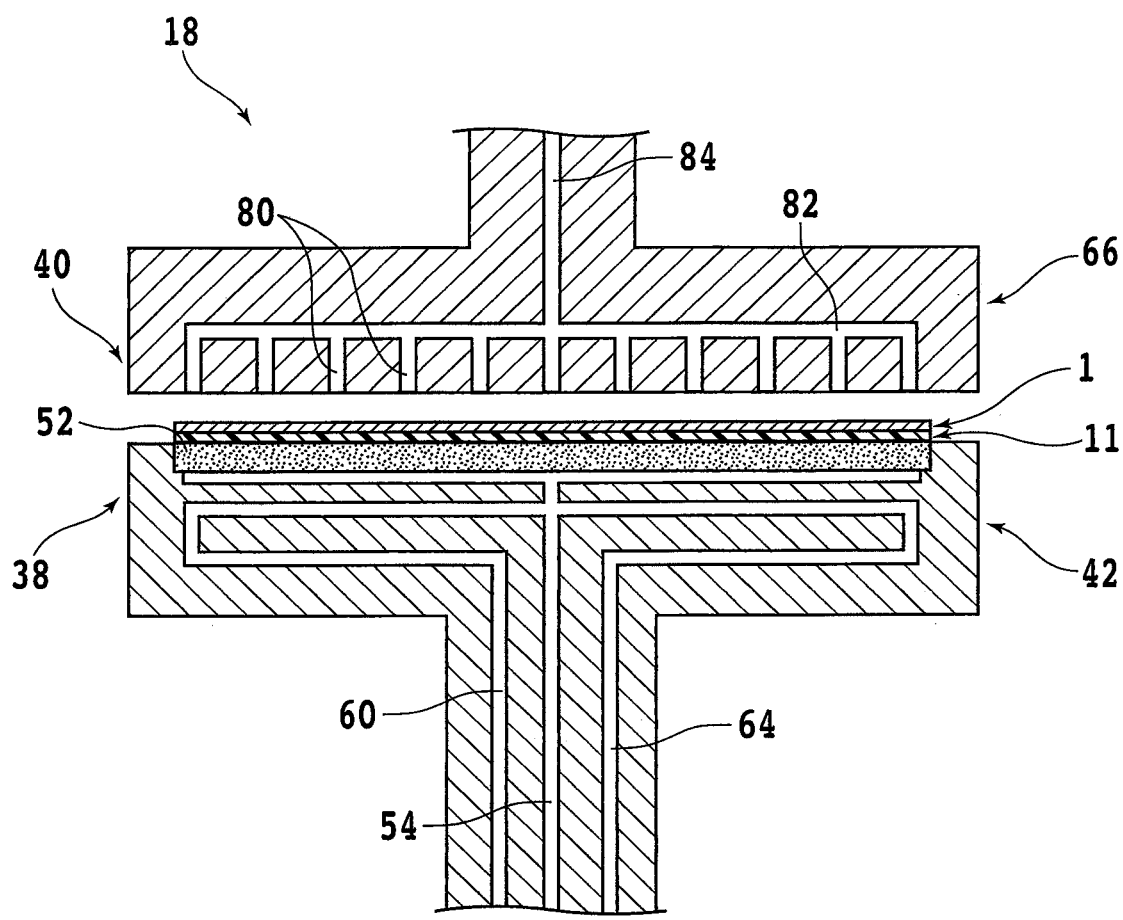
FIG. 6A is a cross-sectional view schematically illustrating the wafer fixed to the table in a distorted layer forming step.

The distorted layer forming step S8 may be carried out in the vacuum chamber 20 following the electrode protruding step S3 while the wafer 1 remains housed in the vacuum chamber 20 from the electrode protruding step S3. In this case, after the first etching gas has been discharged, the inactive gas turned to the plasma is introduced into the vacuum chamber 20. FIG. 6A schematically illustrates in cross section the wafer 1 fixed to the table 52 in the vacuum chamber 20 in the distorted layer forming step S8.

In the distorted layer forming step S8, while the inactive gas for plasma process is being supplied at a predetermined flow rate to the wafer 1 fixed to the table 52, predetermined high-frequency electric power is applied between the lower electrode 38 and the upper electrode 40. In the distorted layer forming step S8, while a predetermined pressure ranging from 5 to 50 Pa, for example, is being maintained in the treatment space 18, an inactive gas such as a noble gas or the like is supplied from the second gas supply 88 at the predetermined flow rate to the treatment space 18, and predetermined high-frequency electric power ranging from 1000 to 3000 W, for example, is applied between the lower electrode 38 and the upper electrode 40. Now, a plasma is generated between the lower electrode 38 and the upper electrode 40, and ions produced from the inactive gas turned to the plasma are attracted toward the lower electrode 38 and supplied to the reverse side 1b of the wafer 1. The supplied ions sputter the reverse side 1b, forming minute surface irregularities and cracks or distortions on the reverse side 1b.

The region of the reverse side 1b where the distortions are formed becomes a distorted layer 15.

Figure 6B:
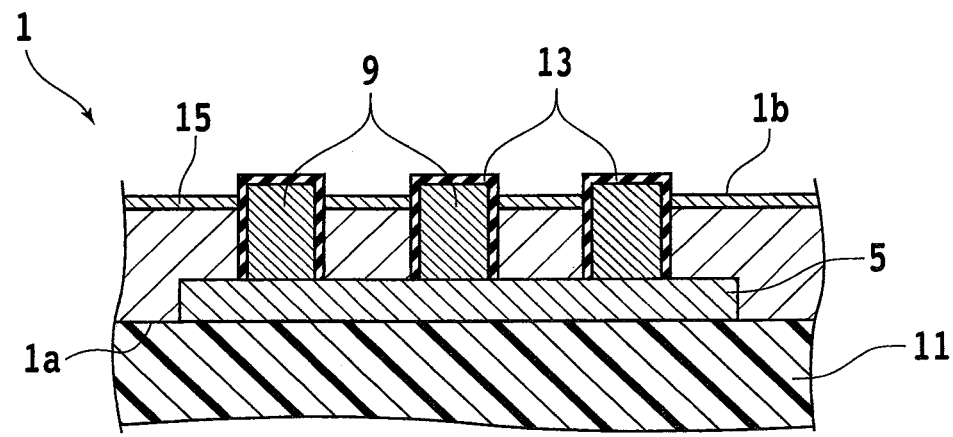
FIG. 6B is a fragmentary cross-sectional view schematically illustrating at an enlarged scale the wafer after the distorted layer forming step has been carried out thereon.

FIG. 6B schematically illustrates in cross section at an enlarged scale the wafer 1 on which the distorted layer forming step S8 has been carried out. As illustrated in FIG. 6B, when the distorted layer forming step S8 has been carried out, the distorted layer 15 is formed on the reverse side 1b of the wafer 1. The distorted layer 15 functions as a gettering layer for trapping metal elements that tend to enter the wafer 1 from the reverse side 1b thereof.

In the case where the distorted layer 15 functioning as the gettering layer is formed by the distorted layer forming step S8, a film growing apparatus for growing a silicon nitride film or the like on the reverse side 1b of the wafer 1 is not necessary. Specifically, when providing the distorted layer forming step S8 is carried out following the electrode protruding step S3, the distorted layer forming step S8 can be performed simply by changing gases supplied to the wafer 1 in the plasma treating apparatus 16 after the electrode protruding step S3 has been performed. In other words, the cost required to carry out the distorted layer forming step S8 is very low, so that a gettering layer can be formed efficiently on the reverse side 1b of the wafer 1. The steps of processing the wafer 1 with via electrodes embedded therein and manufacturing the device chips having the via electrodes are thus simplified, so that the wafer 1 can be processed with a high processing efficiency.

In the distorted layer forming step S8, the distorted layer 15 is formed by bombarding reverse side 1b of the wafer 1 with the inactive gas turned to the plasma. In this process, debris may possibly be produced from the wafer 1, and applied to and deposited on the inner wall surfaces of the vacuum chamber 20. However, providing the electrode protruding step S3 and the distorted layer forming step S8 are carried out in the vacuum chamber 20, after the distorted layer forming step S8, the electrode protruding step S3 is performed on a next wafer in the vacuum chamber 20. In such the electrode protruding step S3, the first etching gas turned to the plasma is supplied to the reverse side 1b of the wafer 1 and also reaches the debris deposited on the inner wall surfaces of the vacuum chamber 20, removing the debris. Therefore, when the electrode protruding step S3 and the distorted layer forming step S8 are carried out on a succession of wafers one by one in the vacuum chamber 20, since the debris is automatically removed, the frequency of cleaning of the vacuum chamber 20 for maintenance is lowered, resulting in a higher wafer processing efficiency.

Figure 7A:
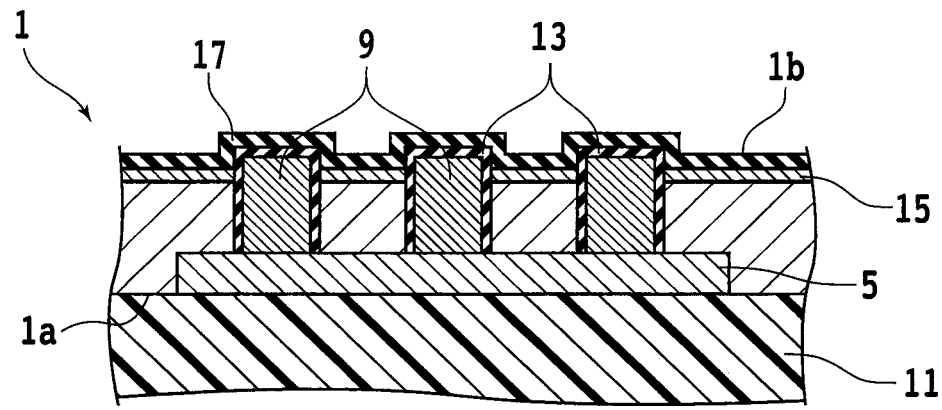
FIG. 7A is a fragmentary cross-sectional view schematically illustrating at an enlarged scale the wafer on which an insulating film forming step has been carried out.

In the case where the distorted layer forming step S8 is carried out after the electrode protruding step S3, the insulating film forming step S4 is carried out after the distorted layer forming step S8. A case in which the distorted layer forming step S8 is carried out will be described below by way of example. In the insulating film forming step S4, a second insulating film is formed on the reverse side 1b of the wafer 1 with the distorted layer 15 formed thereon. FIG. 7A schematically illustrates in fragmentary cross section at an enlarged scale the wafer 1 on which the insulating film forming step S4 has been carried out. In the insulating film forming step S4, a silicon oxide film is formed as a second insulating film 17, for example, on the reverse side 1b of the wafer 1 by sputtering, CVD, or the like. The second insulating film 17 functions as a passivation film for protecting the reverse side 1b of the wafer 1.

After the insulating film forming step S4, the via electrode exposing step S5 is carried out to expose the via electrodes 9 on the reverse side 1b of the wafer 1. In the via electrode exposing step S5, the first insulating films 13 and the second insulating film 17 are removed from the regions where they overlap the via electrodes 9, thereby exposing the via electrodes 9. Heretofore, in the step of exposing the via electrodes 9 on the reverse side 1b, a CMP process has been performed to remove the insulating films overlapping the via electrodes 9. However, the step of removing the insulating films by CMP is costly to carry out, and accounts for a large percentage of the cost required by the steps of forming a plurality of device chips from the wafer 1 and layering the device chips into a package chip. In the via electrode exposing step S5 of the method of processing a wafer according to the present embodiment, the via electrodes 9 are exposed on the reverse side 1b without a CMP process.

Figure 7B:
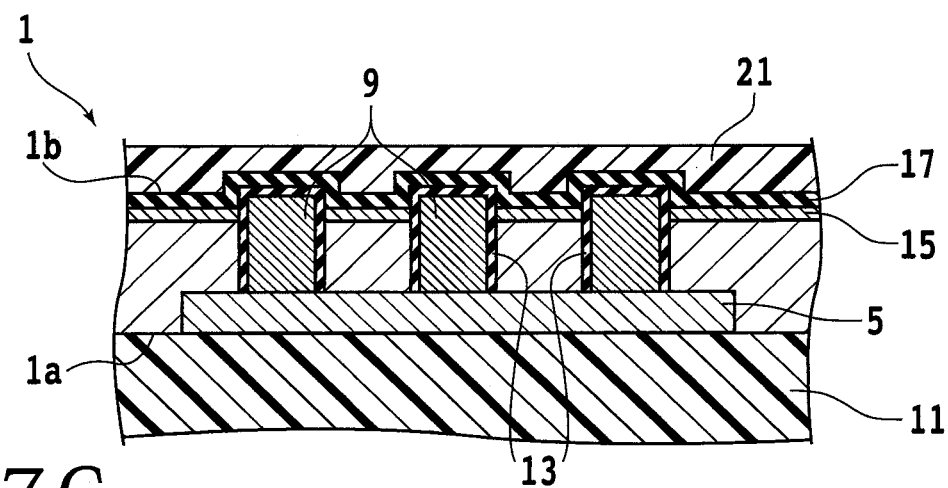
FIG. 7B is a fragmentary cross-sectional view schematically illustrating at an enlarged scale the wafer with a resist film formed on a reverse side thereof.
Figure 7C:
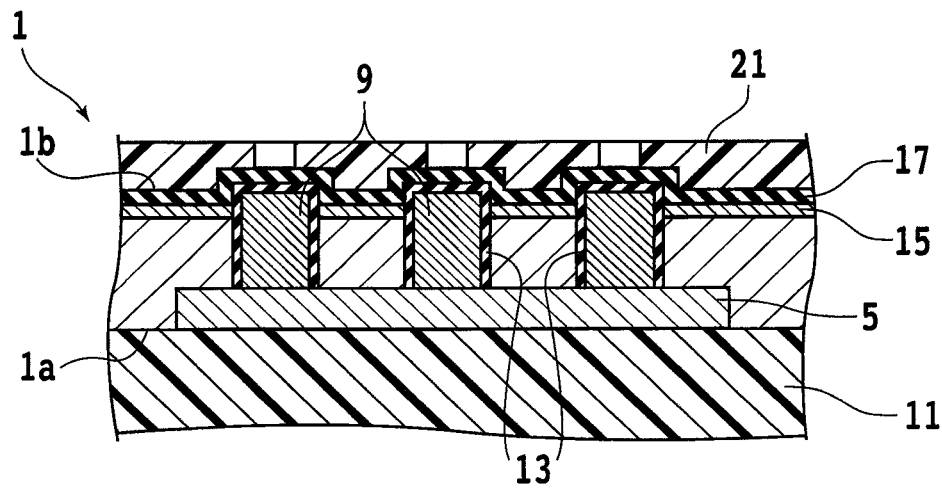
FIG. 7C is a fragmentary cross-sectional view schematically illustrating at an enlarged scale the wafer with openings defined in the resist film.

In the via electrode exposing step S5, as illustrated in FIG. 7B, a resist film 21 is initially formed on the reverse side 1b of the wafer 1. The resist film 21 is made of a negative photoresist material or a positive photoresist material, for example. Then, the resist film 21 is exposed to light and processed by a developing liquid at predetermined locations thereon, thereby forming openings in the resist film 21 at regions overlying the via electrodes 9, as illustrated in FIG. 7C.

Figure 8A:
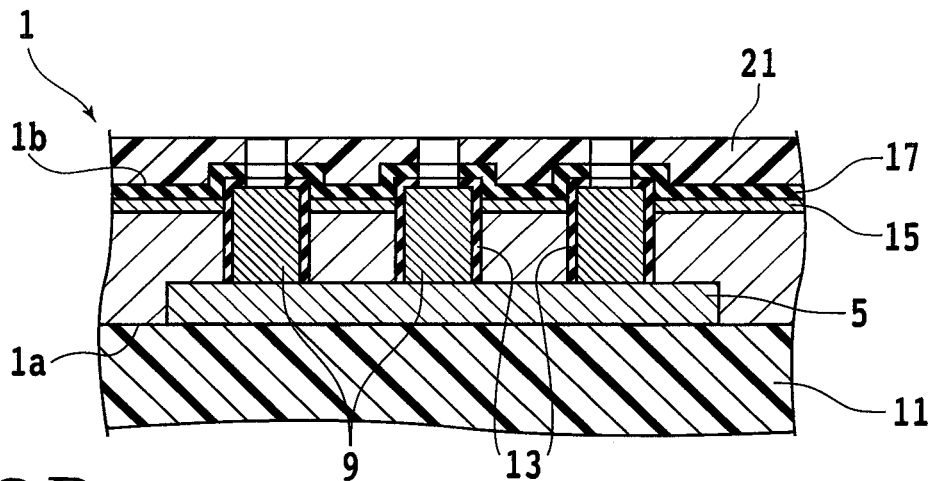
FIG. 8A is a fragmentary cross-sectional view schematically illustrating at an enlarged scale the wafer from which first insulating films and a second insulating film underlying the openings have been removed.

In the via electrode exposing step S5, next, the first insulating films 13 and the second insulating film 17 are removed from the regions where they underlie the openings in the resist films 21. The first insulating films 13 and the second insulating film 17 are removed by the plasma treating apparatus 16 on which the electrode protruding step S3 has been carried out or by another plasma treating apparatus that is of a similar structure to the plasma treating apparatus 16. Specifically, the wafer 1 is placed in the vacuum chamber of the plasma treating apparatus, and a second etching gas turned to a plasma is supplied to the reverse side 1b of the wafer 1. The second etching gas is $C_4F_6$, $C_4F_8$, or the like, for example, and is mixed with a hydrogen gas or the like at a predetermined ratio before it is supplied to the wafer 1. When the second etching gas turned to a plasma is supplied to the reverse side 1b of the wafer 1, the first insulating films 13 and the second insulating film 17 are removed from the regions where they underlie the openings in the resist films 21, as illustrated in FIG. 8A.

Figure 8B:
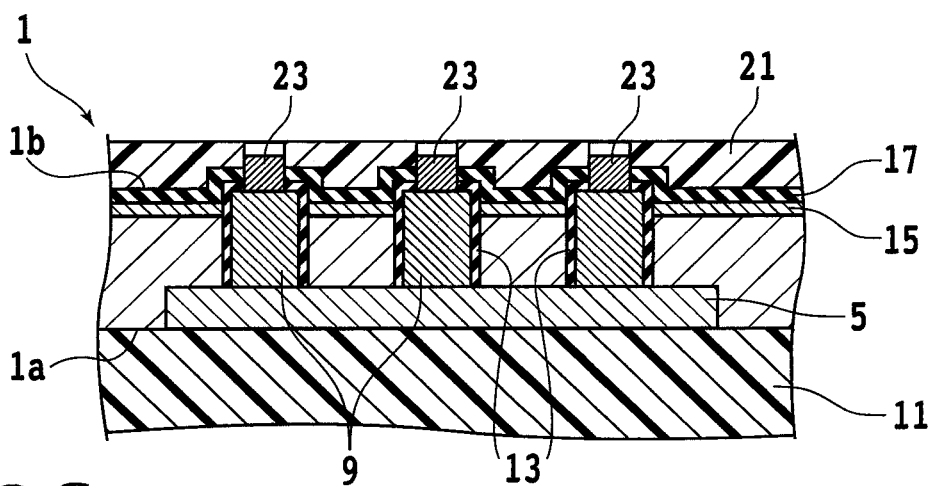
FIG. 8B is a fragmentary cross-sectional view schematically illustrating at an enlarged scale the wafer with electrodes formed therein that are connected to the via electrodes.

Next, the electrode forming step S6 is carried out to form electrodes connected to the exposed via electrodes 9. The electrodes connected to the exposed via electrodes 9 are formed by electroplating, for example. FIG. 8B schematically illustrates in fragmentary cross section at an enlarged scale the wafer 1 with electrodes 23 formed therein that are connected to the via electrodes 9. The electrodes 23 connected to the exposed via electrodes 9 are made of metal such as nickel (Ni), tin (Sn), Cu, gold (Au), or the like or a laminate of these metals, for example. The electrodes 23, for example, include a Cu layer and an Sn layer on the Cu layer. In the method of processing a wafer according to the present embodiment, the resist film 21 with the openings defined therein is formed on the reverse side 1b of the wafer 1. When electroplating is performed on the wafer 1, the electrodes 23 are formed in the openings. In other words, when the electrodes 23 are formed using the resist film 21, the regions where the electrodes 23 are to be formed are strictly defined. Furthermore, as the via electrodes 9 exist at the bottoms of the regions where the electrodes 23 are to be formed, it is not necessary to form an electrode for electroplating in the regions where the electrodes 23 are to be formed on the reverse side 1b of the wafer 1.

Figure 8C:
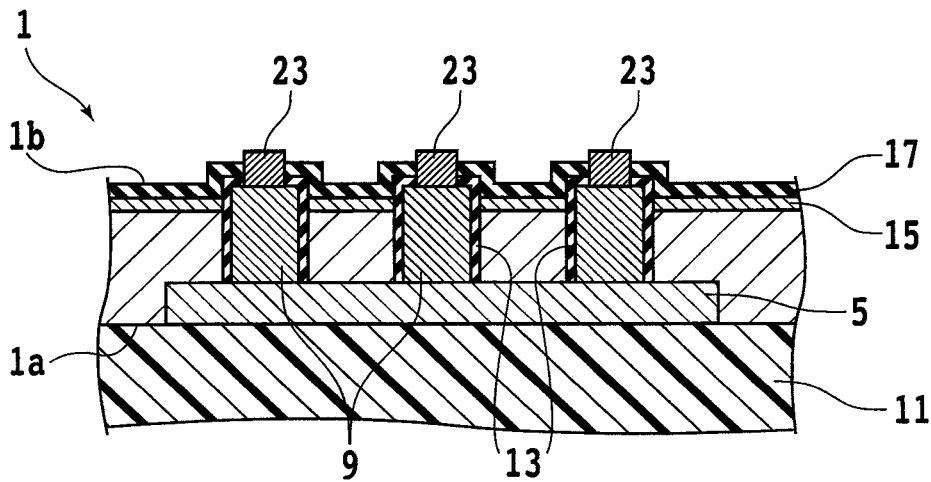
FIG. 8C is a fragmentary cross-sectional view schematically illustrating at an enlarged scale the wafer from which the resist film has been removed.

In the method of processing a wafer according to the present embodiment, next, the resist removing step S7 is carried out to remove the resist film 21. FIG. 8C schematically illustrates in fragmentary cross section at an enlarged scale the wafer 1 from which the resist film 21 has been removed. The wafer 1 with the resist film 21 removed therefrom has the electrodes 23 connected respectively to the via electrodes 9. Thereafter, the wafer 1 is divided into device chips that have the respective devices 5.

In the method of processing a wafer according to the present embodiment, as described above, since the via electrodes 9 can be exposed on the reverse side 1b of the wafer 1 without a highly costly CMP process, the cost of manufacturing device chips can be reduced. In addition, as the resist film 21 is used not only in the removal of the first insulating films 13 and the second insulating film 17, but also in the formation of the electrodes 23 connected to the via electrodes 9, the efficiency with which to process the wafer 1 is very high.

Figure 9A:
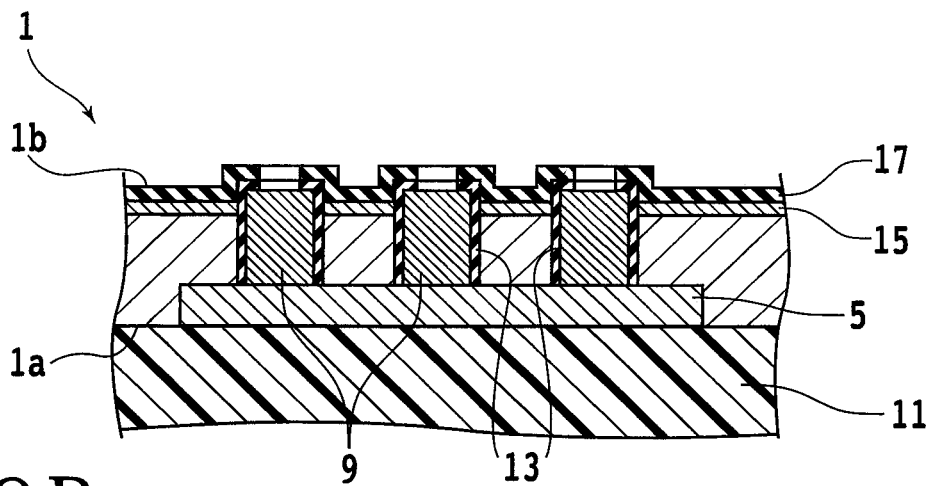
FIG. 9A is a fragmentary cross-sectional view schematically illustrating at an enlarged scale the wafer from which first insulating films and a second insulating film underlying the openings have been removed and thereafter the resist film has been removed.

The method of processing a wafer according to the present invention is not limited to the above details. Electrodes connected to the via electrodes 9 may be formed on the reverse side 1b of the wafer 1 by other processes. A method of processing a wafer according to another embodiment will be described below. The method of processing a wafer according to the other embodiment, as with the method of processing a wafer according to the above embodiment, carries out the protective member placing step S1, the grinding step S2, the electrode protruding step S3, the distorted layer forming step S8, the insulating film forming step S4, and the via electrode exposing step S5. Then, the resist removing step S7 is carried out to remove the resist film 21 that has been formed on the reverse side 1b of the wafer 1 in the via electrode exposing step S5. FIG. 9A schematically illustrates in fragmentary cross section at an enlarged scale the wafer 1 from which the resist film 21 has been removed.

Figure 9B:
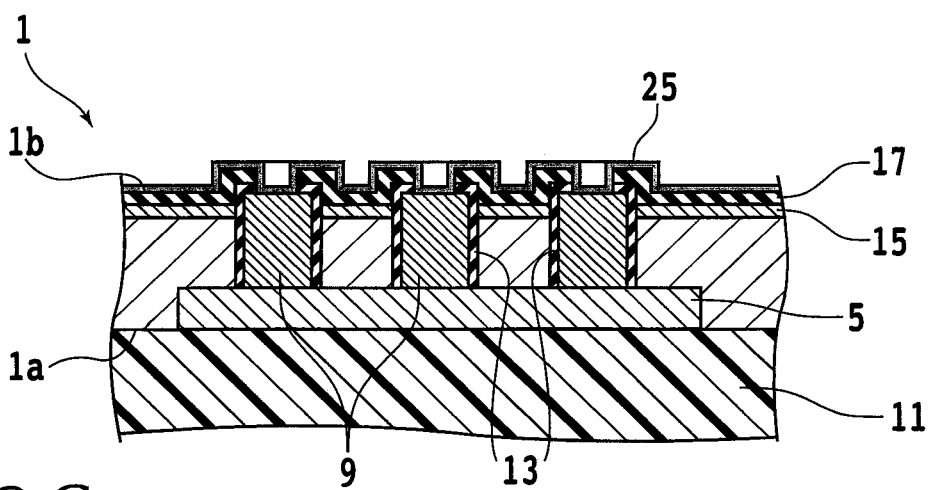
FIG. 9B is a fragmentary cross-sectional view schematically illustrating at an enlarged scale the wafer with an electrode for electroplating formed thereon.
Figure 9C:
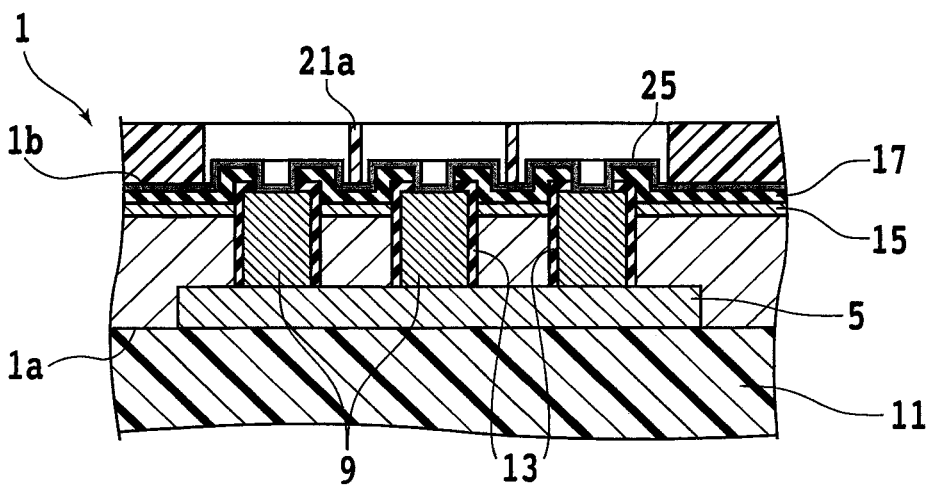
FIG. 9C is a fragmentary cross-sectional view schematically illustrating at an enlarged scale the wafer with a resist film formed thereon that has openings defined therein which are used to form electrodes connected to the via electrodes.

In the method of processing a wafer according to the other embodiment, next, the electrode forming step S6 is carried out. In the electrode forming step S6, an electrode 25 to be used to form electrodes connected to the via electrodes 9 by way of electroplating is initially formed on the reverse side 1b of the wafer 1. FIG. 9B schematically illustrates in fragmentary cross section at an enlarged scale the wafer 1 with the electrode 25 formed thereon. The electrode 25 includes a Cu layer and a titanium (Ti) layer formed on the Cu layer, for example, and is formed by sputtering or the like. In the electrode forming step S6, then, a resist film 21a is formed on the reverse side 1b of the wafer 1 to define regions where electrodes connected to the via electrodes 9 are to be formed. FIG. 9C schematically illustrates in fragmentary cross section at an enlarged scale the wafer 1 with the resist film 21a formed on the reverse side 1b thereof. The resist film 21a has a plurality of openings defined therein that overlap the respective via electrodes 9. The resist film 21a is of a similar material to the resist film 21. The resist film 21a is formed by coating the reverse side 1b of the wafer 1 with a resist material, exposing predetermined regions thereof to light, and then developing them.

Figure 10A:
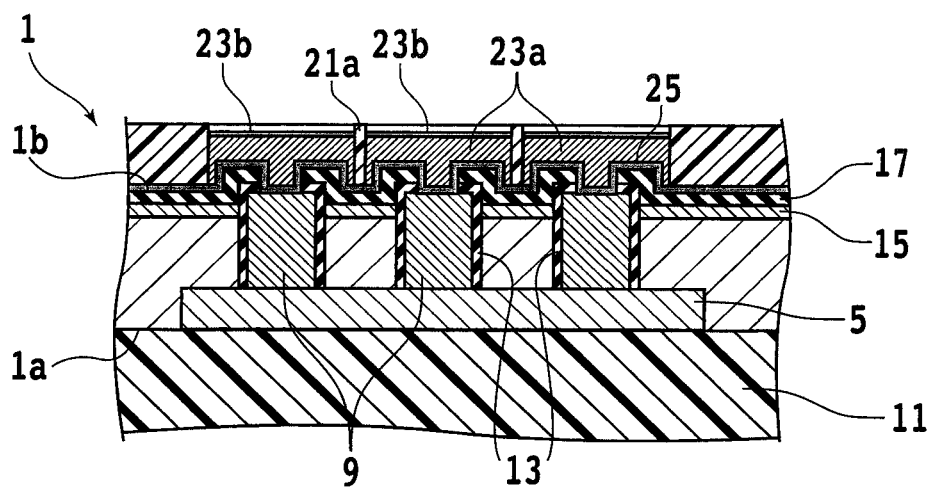
FIG. 10A is a fragmentary cross-sectional view schematically illustrating at an enlarged scale the wafer with electrodes formed therein that are connected to the via electrodes.
Figure 10B:
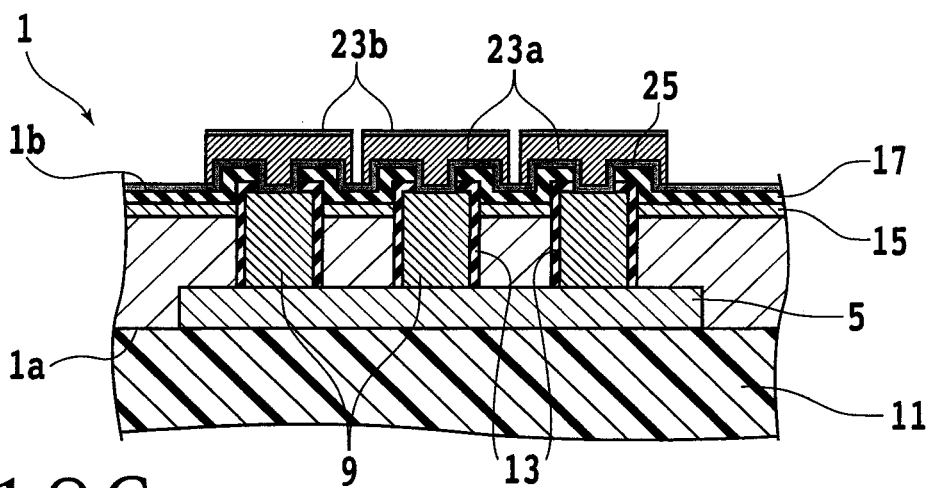
FIG. 10B is a fragmentary cross-sectional view schematically illustrating at an enlarged scale the wafer from which the resist film has been removed.
Figure 10C:
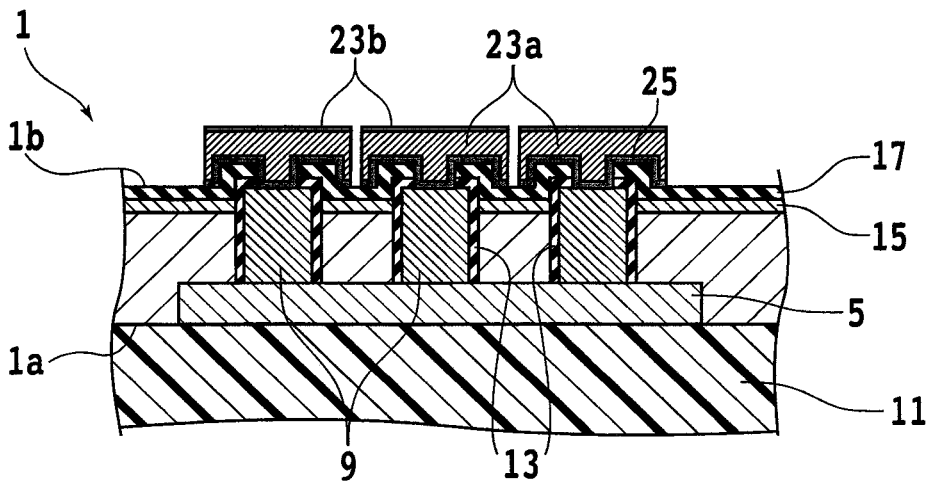
FIG. 10C is a fragmentary cross-sectional view schematically illustrating at an enlarged scale the wafer from which unwanted portions of the electrode for electroplating have been removed.

In the electrode forming step S6, next, electroplating is performed to layer electrodes 23a and 23b in the regions exposed in the openings in the resist film 21a on the reverse side 1b of the wafer 1. FIG. 10A schematically illustrates in fragmentary cross section at an enlarged scale the wafer 1 with the electrodes 23a and 23b formed therein on the reverse side 1b of the wafer 1. The electrodes 23a are made of Ni, Cu, Au, or the like, for example. The electrodes 23b are made of Sn, for example. In the electrode forming step S6, then, the resist film 21a is removed. FIG. 10B schematically illustrates in fragmentary cross section at an enlarged scale the wafer 1 from which the resist film 21a has been removed. In the electrode forming step S6, thereafter, unwanted portions of the electrode 25 used for electroplating are removed. Specifically, the portions of the electrode 25 in the regions underlying the electrodes 23a and 23b are left unremoved, whereas the portions of the electrode 25 in the regions not underlying the electrodes 23a and 23b are removed. FIG. 10C schematically illustrates in fragmentary cross section at an enlarged scale the wafer 1 from which the unwanted portions of the electrode 25 have been removed.

When the unwanted portions of the electrode 25 are removed, the electrodes 23a and the electrodes 23b function as a resist in the removal step. Therefore, no separate resist film needs to be formed. Upon removal of the unwanted portions of the electrode 25, as illustrated in FIG. 10C, layered bodies of the electrode 25, the electrodes 23a, and the electrodes 23b are formed as the electrodes connected to the via electrodes 9. In the method of processing a wafer according to the other embodiment, the electrodes connected to the via electrodes 9 are formed by using the resist film 21a, which is different from the resist film 21 used in the via electrode exposing step S5 and removed in the resist removing step S7. Consequently, the electrodes connected to the via electrodes 9 can have their shape freely determined insofar as they are kept out of contact with the other electrodes. For example, the electrodes connected to the via electrodes 9 can have their shape determined to facilitate the step of interconnecting a plurality of device chips including devices through via electrodes 9.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a wafer, comprising the steps of:
    placing a protective member on a face side of a wafer having a plurality of intersecting projected dicing lines thereon that demarcate the face side into areas with devices formed therein, the areas having via electrodes embedded in the wafer and extending in thicknesswise directions, and first insulating films covering the via electrodes;
    holding a protective member side of the wafer on a chuck table and grinding the wafer on a reverse side thereof to an extent that the first insulating films covering the via electrodes are not be exposed;
    after the step of grinding the wafer, housing the wafer in a vacuum chamber, supplying a first etching gas turned to a plasma to the reverse side of the wafer, thereby protruding the via electrodes covered with the first insulating films from the reverse side of the wafer;
    after the step of protruding the via electrodes, covering the reverse side of the wafer with a second insulating film;
    after the step of covering the reverse side of the wafer with the second insulating film, forming a resist film having openings overlapping the via electrodes on the reverse side of the wafer, thereafter supplying a second etching gas turned to a plasma to the reverse side of the wafer to remove regions of the first insulating films and the second insulating films underlying the openings, thereby exposing the via electrodes;
    after the step of exposing the via electrodes, forming electrodes connected to the exposed via electrodes; and
    removing the resist film.

2. The method of processing a wafer according to claim 1, wherein the step of forming the electrodes includes a step of forming the electrodes connected to the via electrodes by way of plating, using the resist film formed in the step of exposing the via electrodes.

3. The method of processing a wafer according to claim 1, further comprising a step of:
after the step of protruding the via electrodes and before the step of covering the reverse side of the wafer with the second insulating film, forming a distorted layer on the reverse side of the wafer by supplying an inactive gas turned to a plasma to the reverse side of the wafer.

4. The method of processing a wafer according to claim 3, wherein the step of forming the distorted layer includes the steps of keeping the wafer housed in the vacuum chamber used in the step of protruding the via electrodes, discharging the first etching gas from the vacuum chamber, and then supplying the inactive gas turned to a plasma to the reverse side of the wafer thereby forming the distorted layer.

5. The method of processing a wafer according to claim 1, further comprising a step of:
after the step of protruding the via electrodes and before the step of covering the reverse side of the wafer with the second insulating film, forming a gettering layer on the reverse side of the wafer by forming a silicon nitride film as a gettering layer to trap metal elements that tend to enter the wafer.

6. The method of processing a wafer according to claim 1, wherein the step of forming electrodes connected to the exposed via electrodes includes forming the electrodes by electroplating.

* * * * *